(12) United States Patent
Park (10) Patent No.: US 11,493,953 B2
(45) Date of Patent: Nov. 8, 2022

(54) MULTI-POSITION DISPLAY WITH AN UNFIXED CENTER OF ROTATION

(71) Applicant: Microsoft Technology Licensing, LLC, Redmond, WA (US)

(72) Inventor: Daniel C. Park, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/458,677

(22) Filed: Jul. 1, 2019

(65) Prior Publication Data

US 2021/0004046 A1 Jan. 7, 2021

(51) Int. Cl.
*G06F 1/16* (2006.01)
*H05K 5/00* (2006.01)
(Continued)

(52) U.S. Cl.
CPC ......... *G06F 1/1601* (2013.01); *F16M 11/105* (2013.01); *F16M 11/22* (2013.01); *H05K 5/0017* (2013.01); *H05K 5/0204* (2013.01); *F16M 2200/041* (2013.01); *G06F 2200/1612* (2013.01)

(58) Field of Classification Search
CPC .......... G06F 1/1601; G06F 2200/1612; H05K 5/0204; H05K 5/0017; F16M 11/105; F16M 11/22; F16M 2200/041
See application file for complete search history.

(56) References Cited

U.S. PATENT DOCUMENTS

| 4,768,744 A | 9/1988 | Leeds et al. |
| 4,953,256 A | 9/1990 | Salmela et al. |

(Continued)

FOREIGN PATENT DOCUMENTS

| CN | 2610385 Y | 4/2004 |
| CN | 1655016 A | 8/2005 |

(Continued)

OTHER PUBLICATIONS

"Future Automation QA2-PTL Portrait to Landscape Electric TV Bracket at CEDIA 2016", Retrieved from https://www.youtube.com/watch?v=2cn4Jj0HL-U, Dec. 13, 2016, 3 Pages.

(Continued)

*Primary Examiner* — Anthony M Haughton
*Assistant Examiner* — Theron S Milliser
(74) *Attorney, Agent, or Firm* — International IP Law Group, PLLC (57) ABSTRACT

A device for supporting an electronic display includes a support surface, a display mount configured to be coupled to a display, and a connection mechanism to connect the display mount to the support surface. The connection mechanism is configured to enable a rotation of the display mount between a first position and a second position. The device also includes a set of springs to provide a spring torque that counterbalances a gravitational torque exerted by the display. The connection mechanism causes a translation of the center point of the display relative to the support surface in concert with the rotation. The connection mechanism also causes the center of rotation of the display to shift during the rotation.

20 Claims, 10 Drawing Sheets

(51) Int. Cl.
  *H05K 5/02* (2006.01)
  *F16M 11/10* (2006.01)
  *F16M 11/22* (2006.01)

(56) References Cited

U.S. PATENT DOCUMENTS

| | | | | |
|---|---|---|---|---|
| 5,791,621 | A * | 8/1998 | Yashima | A47B 81/065 |
| | | | | 248/371 |
| 5,842,672 | A | 12/1998 | Sweere et al. | |
| 5,941,493 | A | 8/1999 | Cheng | |
| 6,227,508 | B1 | 5/2001 | Panzarella et al. | |
| 6,233,139 | B1 * | 5/2001 | Hamon | F16M 11/105 |
| | | | | 248/918 |
| 6,427,288 | B1 | 8/2002 | Saito | |
| 6,639,788 | B1 | 10/2003 | Liao et al. | |
| 6,966,532 | B2 | 11/2005 | Ishizaki et al. | |
| 7,159,833 | B2 * | 1/2007 | Kato | H04M 1/0237 |
| | | | | 248/292.13 |
| 7,252,277 | B2 | 8/2007 | Sweere et al. | |
| 7,490,796 | B2 | 2/2009 | Kim | |
| 7,496,389 | B2 * | 2/2009 | Cho | H04M 1/0237 |
| | | | | 455/575.1 |
| 7,577,466 | B2 * | 8/2009 | Kim | H04M 1/0247 |
| | | | | 379/433.01 |
| 7,738,243 | B2 * | 6/2010 | Oshima | F16M 11/105 |
| | | | | 206/459.5 |
| 7,930,008 | B2 * | 4/2011 | Ko | H04M 1/0237 |
| | | | | 455/566 |
| 7,997,555 | B2 | 8/2011 | Lee et al. | |
| 8,380,257 | B2 * | 2/2013 | Jeong | H04M 1/0237 |
| | | | | 455/550.1 |
| 8,471,820 | B2 * | 6/2013 | Holman, IV | G06F 1/1622 |
| | | | | 345/169 |
| 8,593,801 | B2 * | 11/2013 | Minowa | H04M 1/0237 |
| | | | | 361/679.3 |
| 8,693,188 | B2 * | 4/2014 | Holman, IV | G06F 1/1622 |
| | | | | 361/679.26 |
| 8,724,037 | B1 | 5/2014 | Massey | |
| 9,415,727 | B2 * | 8/2016 | Koseki | B60R 11/0235 |
| 9,528,653 | B1 | 12/2016 | Hsu et al. | |
| 9,936,593 | B2 * | 4/2018 | Deily | F16M 11/2021 |
| 2002/0089522 | A1 | 7/2002 | Wu | |
| 2005/0041379 | A1 | 2/2005 | Jang | |
| 2005/0107137 | A1 * | 5/2005 | Byun | H04M 1/0237 |
| | | | | 455/575.1 |
| 2005/0205731 | A1 * | 9/2005 | Shimizu | F16M 11/105 |
| | | | | 248/176.3 |
| 2006/0007644 | A1 * | 1/2006 | Huilgol | G06F 1/1679 |
| | | | | 361/679.07 |
| 2006/0030381 | A1 * | 2/2006 | Byun | H04M 1/0237 |
| | | | | 455/575.4 |
| 2006/0033847 | A1 * | 2/2006 | Kim | F16M 11/105 |
| | | | | 348/836 |
| 2006/0175476 | A1 | 8/2006 | Hasegawa et al. | |
| 2006/0219849 | A1 | 10/2006 | Chiu | |
| 2006/0223596 | A1 * | 10/2006 | Hur | H04M 1/0233 |
| | | | | 455/575.4 |
| 2007/0064379 | A1 | 3/2007 | Shin | |
| 2007/0242820 | A1 * | 10/2007 | Tseng | H04M 1/0227 |
| | | | | 379/433.12 |
| 2007/0262210 | A1 | 11/2007 | Oh et al. | |
| 2007/0293283 | A1 * | 12/2007 | Inubushi | H04M 1/0237 |
| | | | | 455/575.1 |
| 2008/0064452 | A1 * | 3/2008 | Kim | H04M 1/0233 |
| | | | | 455/575.3 |
| 2008/0081591 | A1 * | 4/2008 | Kim | H04M 1/0233 |
| | | | | 455/349 |
| 2008/0096619 | A1 * | 4/2008 | Kuga | H04M 1/0237 |
| | | | | 455/575.4 |
| 2009/0002391 | A1 | 1/2009 | Williamson et al. | |
| 2009/0036181 | A1 * | 2/2009 | Lee | H04M 1/0237 |
| | | | | 455/575.4 |
| 2009/0066031 | A1 | 3/2009 | Moray et al. | |
| 2009/0179133 | A1 | 7/2009 | Gan et al. | |
| 2009/0242722 | A1 * | 10/2009 | Lee | F16M 11/2021 |
| | | | | 248/371 |
| 2009/0278006 | A1 | 11/2009 | Park et al. | |
| 2010/0178963 | A1 * | 7/2010 | Iwaki | G06F 1/1622 |
| | | | | 455/575.4 |
| 2010/0197372 | A1 * | 8/2010 | Takagi | H04M 1/0237 |
| | | | | 455/575.4 |
| 2010/0216512 | A1 * | 8/2010 | Aghaei | H04M 1/0241 |
| | | | | 455/566 |
| 2010/0248796 | A1 * | 9/2010 | Higashigawa | H04M 1/0237 |
| | | | | 455/575.4 |
| 2012/0008270 | A1 | 1/2012 | Tsuchihashi et al. | |
| 2013/0147847 | A1 * | 6/2013 | Koseki | B60R 11/0235 |
| | | | | 345/660 |
| 2014/0029176 | A1 | 1/2014 | Chiang | |
| 2014/0355200 | A1 | 12/2014 | Thiers | |
| 2015/0211675 | A1 * | 7/2015 | Shyu | F16M 11/105 |
| | | | | 248/125.7 |
| 2016/0041582 | A1 | 2/2016 | Kim et al. | |
| 2016/0123691 | A1 | 5/2016 | Gaubert et al. | |
| 2016/0236359 | A1 | 8/2016 | Song et al. | |
| 2017/0051866 | A1 | 2/2017 | Chen et al. | |
| 2017/0303415 | A1 | 10/2017 | Deily et al. | |
| 2018/0094766 | A1 | 4/2018 | Yoon et al. | |
| 2019/0033989 | A1 | 1/2019 | Wang et al. | |
| 2019/0064993 | A1 | 2/2019 | Hardie-bick | |
| 2019/0069422 | A1 | 2/2019 | Choi et al. | |
| 2019/0243153 | A1 | 8/2019 | Haseltine et al. | |
| 2019/0316729 | A1 | 10/2019 | Gurr et al. | |
| 2019/0317549 | A1 | 10/2019 | Gurr et al. | |
| 2019/0327841 | A1 | 10/2019 | Li | |
| 2021/0088174 | A1 | 3/2021 | Gurr et al. | |

FOREIGN PATENT DOCUMENTS

| | | |
|---|---|---|
| CN | 1734680 A | 2/2006 |
| CN | 101026014 A | 8/2007 |
| CN | 101471145 A | 7/2009 |
| CN | 101953156 A | 1/2011 |
| CN | 102767678 A | 11/2012 |
| CN | 103582854 A | 2/2014 |
| CN | 104033708 A | 9/2014 |
| CN | 104101995 A | 10/2014 |
| CN | 206723747 U | 12/2017 |
| CN | 207112266 U | 3/2018 |
| CN | 207179085 U | 4/2018 |
| EP | 0096373 A1 | 12/1983 |
| JP | H04203517 A | 7/1992 |
| JP | 2012039241 A | 2/2012 |
| JP | 2017161714 A | 9/2017 |
| KR | 20030058204 A | 7/2003 |
| KR | 100802384 B1 | 2/2008 |
| TW | 444893 U | 7/2001 |
| TW | 200942031 A | 10/2009 |

OTHER PUBLICATIONS

"Non Final Office Action Issued in U.S. Appl. No. 15/953,110", dated Jan. 28, 2019, 14 Pages.

"Non Final Office Action Issued In U.S. Appl. No. 15/953,122", dated Apr. 5, 2019, 18 Pages.

"International Search Report & Written Opinion Issued in PCT Application No. PCT/US19/025090", dated May 17, 2019, 11 Pages.

"Final Office Action Issued In U.S. Appl. No. 15/953,110", dated Aug. 7, 2019, 17 Pages.

"International Search Report and Written Opinion Issued In PCT Patent Application No. PCT/US19/024167", dated Jul. 17, 2019, 11 Pages.

"International Search Report and Written Opinion Issued in PCT Application No. PCT/US2020/031388", dated Aug. 28, 2020, 12 Pages.

"Notice of Allowance Issued in U.S. Appl. No. 15/953,114", dated Jul. 29, 2020, 10 Pages.

"First Office Action and Search Report Issued in Chinese Patent Application No. 201980025427.8", dated Jul. 27, 2021, 15 Pages.

(56) References Cited

OTHER PUBLICATIONS

"First Office Action and Search Report Issued in Chinese Patent Application No. 201980025379.2", dated Jul. 22, 2021, 10 Pages.
"Final Office Action Issued in U.S. Appl. No. 15/953,122", dated Sep. 9, 2021, 25 Pages.
"Office Action Issued in European Patent Application No. 19717178.8", dated Nov. 12, 2021, 5 Pages.
"Second Office Action and Search Report Issued in Chinese Patent Application No. 201980025427 8", dated Feb. 8, 2022, 10 Pages.
"Non Final Office Action Issued in U.S. Appl. No. 17/112,260", dated Feb. 3, 2022, 12 Pages.
"Office Action Issued in Indian Patent Application No. 202047042156", dated Mar. 29, 2022, 6 Pages.
"Office Action Issued in Indian Patent Application No. 202047042161", dated Apr. 1, 2022, 6 Pages.
"Notice of Allowance Issued in Chinese Patent Application No. 201980025427.8", dated Apr. 7, 2022, 4 Pages.

* cited by examiner

MULTI-POSITION DISPLAY WITH AN UNFIXED CENTER OF ROTATION

BACKGROUND

Computing devices are becoming hubs for business meetings, planning, designing, and communications. Some large format computing devices have larger displays and allow input and viewing by more than one user at a time. Collaborative computing devices and other computing devices allow for communication between groups of users, for example, in a business meeting. The collaborative computing device allow for users to interact with other, remote users through the large format display.

However, interaction with other users and presentation and input to the computing device commonly use different orientations or formats for the display and/or computing device. Interacting with a remote user, for example, in a web-conference is more natural when the display is oriented vertically allowing a majority of the user's body to be present in the frame. Presenting information from a website or in an application presentation (e.g., a slideshow) to local users may be more intuitive and comfortable with the display is oriented horizontally allowing more information to be visible to the room.

SUMMARY

The following presents a simplified summary in order to provide a basic understanding of some aspects described herein. This summary is not an extensive overview of the claimed subject matter. This summary is not intended to identify key or critical elements of the claimed subject matter nor delineate the scope of the claimed subject matter. This summary's sole purpose is to present some concepts of the claimed subject matter in a simplified form as a prelude to the more detailed description that is presented later.

In an embodiment described herein, a device for supporting an electronic display includes a support surface, a display mount configured to be coupled to a display, and a connection mechanism to connect the display mount to the support surface. The connection mechanism is configured to enable a rotation of the display mount between a first position and a second position. The device also includes a set of springs to provide a spring torque that counterbalances a gravitational torque exerted by the display. The connection mechanism causes a translation of the center point of the display relative to the support surface in concert with the rotation. The connection mechanism also causes the center of rotation of the display to shift during the rotation.

In another embodiment described herein, a display system includes a base, a display coupled to the base, and a connection mechanism to connect the display to the base. The connection mechanism is configured to enable a rotation of the display relative to the base between a first position and a second position. The display system also includes a set of springs to provide a spring torque that counterbalances a gravitational torque exerted by the display. The connection mechanism causes a translation of the center point of the display relative to the base in concert with the rotation. The connection mechanism also causes the center of rotation of the display to shift during the rotation.

In another embodiment described herein, a method of manufacturing a connection mechanism for a display system includes determining a gravitational torque profile representing a gravitational torque experienced by the display as it rotates from a first position to a second position around a shifting center of rotation. The method also includes determining a spring set configuration that generates a spring torque profile that balances the gravitational torque profile. The method also includes determining shapes and positions of a set of tracks configured to engage a set of rollers, wherein the set of rollers are in a fixed relationship with one another and enable the rotation of the tracks from the first position to the second position around the shifting center of rotation. The method also includes coupling the set of tracks to a first member of the connection mechanism and couple the set of rollers to a second member of the connection mechanism.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

BRIEF DESCRIPTION OF THE DRAWINGS

The following detailed description may be better understood by referencing the accompanying drawings, which contain specific examples of numerous features of the disclosed subject matter.

DETAILED DESCRIPTION

This disclosure generally relates to a display with a movable connection that enables the display to rotate between a first position (e.g., landscape orientation) and a second position (e.g., portrait orientation). The display may be rotated relative to a support surface such as a stand or a wall mount. The display may be a stand-alone computer monitor, or an all-in-one computer with built-in display screen. Pass-through cables, such as power and data cables, may extend from the back of the display near the center of rotation.

In some embodiments, the height of the display in the landscape orientation may be unsuitable if the display is rotated to the portrait orientation. Accordingly, the rotation technique also causes the display to translate relative to the support surface during the rotation. For example, the movable connection may couple the rotational movement and the translational movement of the display such that a pivot point of the connection may translate during rotation of the display about the center of rotation. In some examples, a user rotating the display between a landscape orientation and portrait orientation may rotate the display through a 90° rotation while the center point of the display translates to a new height.

Moving a large format display or other computing device between a portrait orientation and a landscape orientation on a conventional display support may be cumbersome, hazardous, or require multiple adjustments to the display support that interrupts the user experience or limits functionality of the device. For example, the translation component of the movement between the first position and the second position may include moving the mass of the display and display mount relative to gravity. Thus, the rotation and translation of the display relative to the base may be counterbalanced during the movement. The counterbalance force may offset the weight of the display, allowing movement between the first position and the second position with a consistent application of force, irrespective of the direction of movement.

In some examples, the counterbalance force may be applied by one or more springs, such as extension springs. The drop of the display results in a loss of energy that is countered by the springs to maintain a balanced feel. The springs will increase in force as they are extended. In order to match the torque from the springs to the torque required to maintain balance, the anchors for the springs are chosen to decrease the distance of the springs from the center of rotation. The sum of the torque required from the monitor rotation and the torque provided by the springs results in a somewhat weightless feel. One challenge with this solution is that the springs in portrait orientation tend to come close to the center of rotation resulting in possible interference with the pass through cables. Additionally, it is difficult to obtain a weightless feel throughout the complete range of rotation, due to the mismatch between the spring torque and the torque generated by gravity.

Embodiments of the present techniques further improve the rotation mechanism by causing the center of rotation of the display to move throughout the rotation. By controlling the position of the center of rotation, the rate at which the monitor drops throughout the rotation is also changed, which also alters the gravitational torque experienced by the display throughout the rotation. As used herein, the term gravitation torque refers to the torque required to hold the monitor in position against the force of gravity, which will vary depending on the degree of rotation. Through proper control of the dynamic center of rotation, the resulting gravitational torque can be designed to steadily increase throughout the rotation from the first position to the second position. Such a torque profile may be more easily matched by the springs, which also tend to apply increasing torque as the springs are stretched. By matching the gravitational torque to the spring torque more accurately, the net torque required to rotate the display will be closer to zero throughout the rotation, resulting in a more balanced and weightless feel. Additionally, using a dynamic (i.e., not fixed) center of rotation enables the deployment of different spring designs. For example, a fewer number of springs with thicker wire may be used or the anchor points can be chosen to reduce the degree to which the springs pass close to the center of rotation. In this way, the interference between the springs and the pass-through cables can be reduced.

Figure 1:
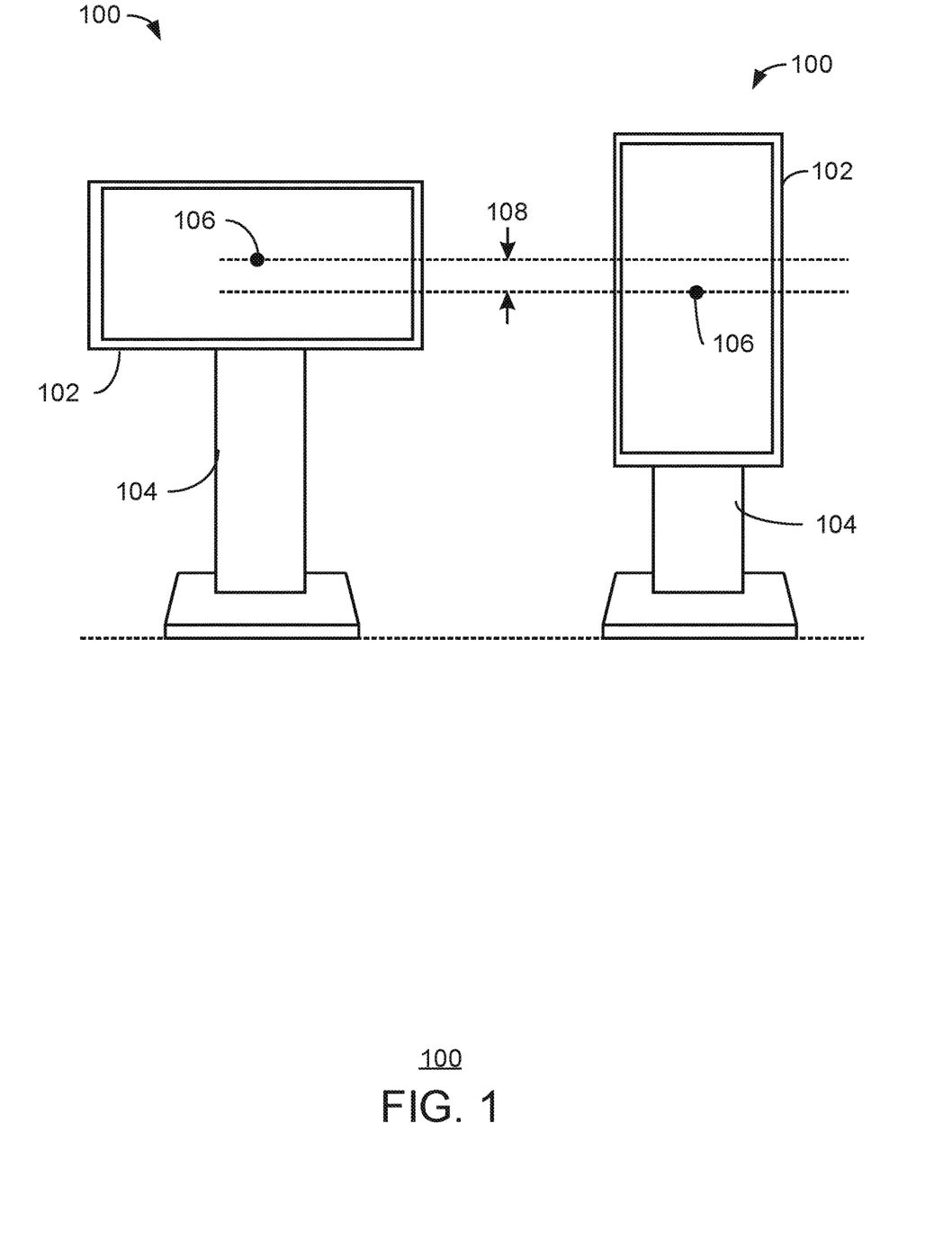
FIG. 1 is a front view of a display system 100 according to implementations described herein.

FIG. 1 is a front view of a display system 100 according to implementations described herein. FIG. 1 shows the same display system 100 in the landscape orientation on the left and the portrait orientation on the right. The display system 100 may include a display 102 and a base 104, where the display 102 is rotatable relative to the base 104. The display 102 may be in data communication with a computing device that provides visual information to the display 102. In some implementations, the display 102 may be an all-in-one computing device in which components of the computing device are contained in a shared housing with the display 102. For example, the display 102 may share a housing with components including a microprocessor, such as a CPU, a GPU, a physics processor, or other general or dedicated microprocessor; system memory, such as RAM, graphics RAM, or other system memory; a hardware storage device (which may have instructions thereon that include one or more methods described herein), such as a platen-based storage device, a solid state storage device, or other non-transitory or long-term storage device, a communication device (e.g., communication by WIFI, BLUETOOTH, Ethernet, or other wired or wireless communication methods), input devices, such as a touch-sensing device, stylus, trackpad, trackball, gesture recognition device, cameras, or other input devices; one or more thermal management devices, such as fans, heat-transfer pipes or fins, liquid cooling conduits, or other thermal management devices; audio devices, such as speakers or audio output connections; power supplies, such as batteries, convertors, or wired power supply units that may be connected to a local electricity grid; or other components of the computing device.

In some examples, the display 102 may be a touch-sensing display that allows users to directly interact with the display 102 and/or visual information presented on the display 102. The display 102 may be a light emitting diode (LED) display, an organic light emitting diode (LED) display, a liquid crystal display (LCD) monitor, or other type of display. Additionally, although the display 102 is shown in FIG. 1 as attached to a base 104, the display 102 may also be attached to another mounting surface such as a wall.

The center of the display 102 is marked by a dot 106. As shown in FIG. 1, the rotation of the display 102 from the landscape to the portrait orientation causes the display 102 to translate downward by a distance 108. The downward translation of the display 102 occurs automatically as the display is rotated by the user over a 90 degree rotation angle. The distance 108 may be a pre-determined distance that is determined by the geometry of the rotation mechanism. The distance 108 may be, for example, 10 millimeters (mm), 50 mm, 100 mm, 300 mm, or more. The distance 108 may be specified based on the expected use of the display 102. For example, if the display is to be used in a video conferencing application, reducing the height of the display 102 for portrait mode may help to better frame the user and may allow a user to access more of the display 102 in the portrait orientation. For example, a large format display may be positioned at eye-level for easy viewing in landscape mode. When rotated into portrait orientation without downward translation, a portion of the display 102 may be positioned too high for a user to access or comfortably access to interact with a touch-sensing display or using a stylus.

In some embodiments, the display 102 can have one or more sensors, such as accelerometers, to determine the position of the display 102. The sensor data can be used to adjust the image generated on the display to maintain the proper orientation regardless of the position of the display 102. Furthermore, although the present disclosure describes reducing the height of the display 102 for portrait mode, some embodiments may instead reduce the height of the display 102 for landscape mode and increase the height of the display 102 for portrait mode.

Figure 2:
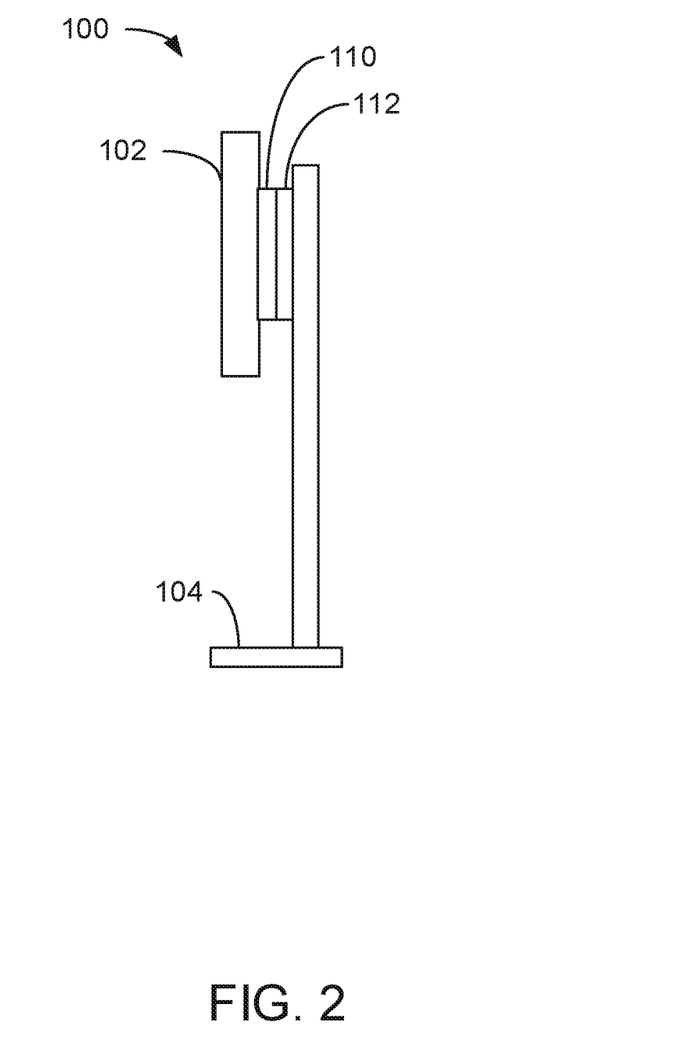
FIG. 2 is a side view of the display system described in relation to FIG. 1.

FIG. 2 is a side view of the display system described in relation to FIG. 1. As shown in FIG. 2, the display system 100 includes a connection mechanism that includes a display mount 110 coupled to the display 102 and a holder 112 coupled to the stand 104. The display mount 110 connects the display 102 to the holder 112 in a manner that enables the rotation and translation of the display 102 relative to the base 104. An example of the connection mechanism is described further below in relation to FIG. 3.

Figure 3:
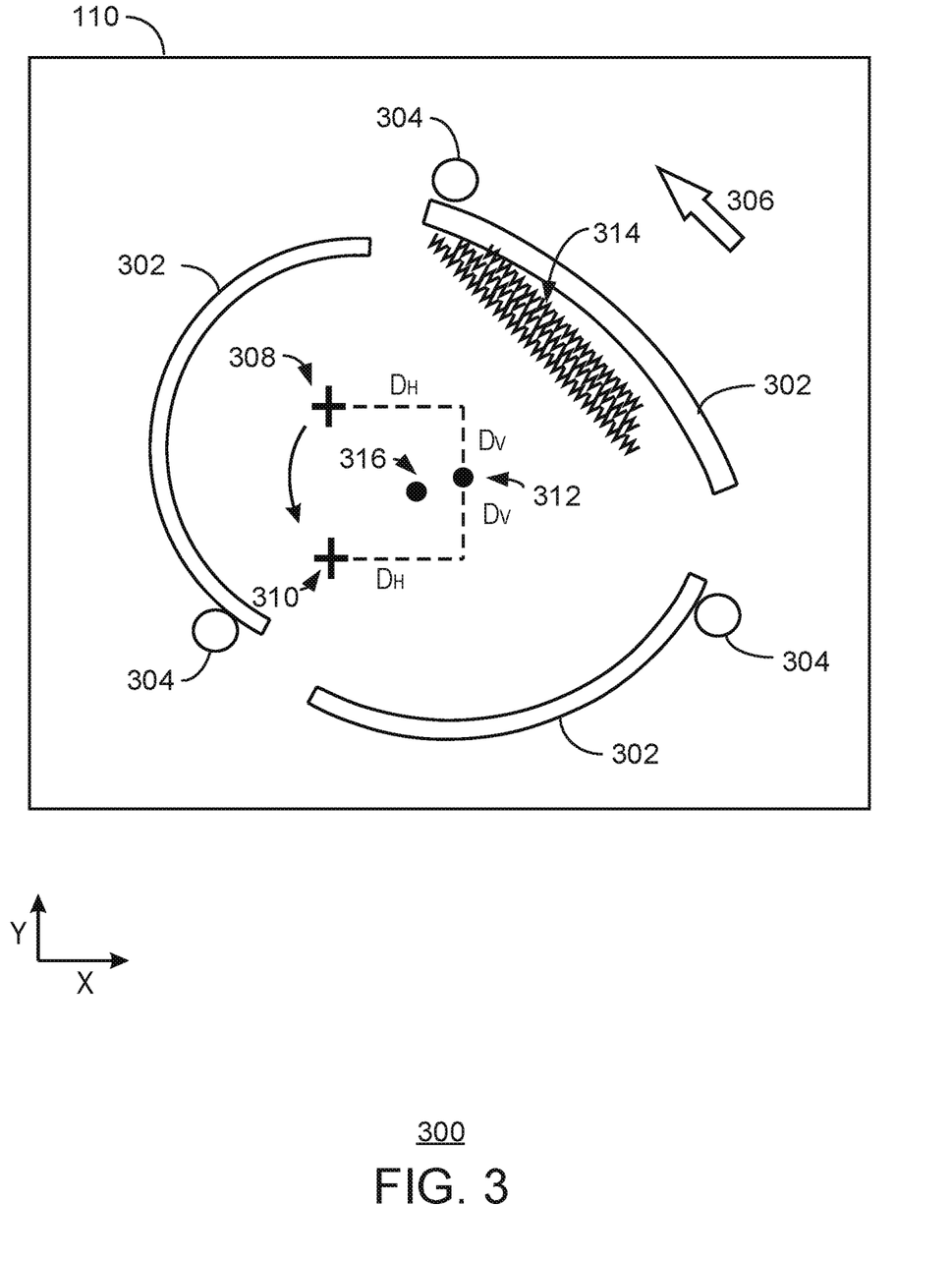
FIG. 3 is a front view of a connection mechanism that converts rotational movement to translational movement according to implementations described herein.

FIG. 3 is a front view of a connection mechanism that converts rotational movement to translational movement according to implementations described herein. The connection mechanism 300 includes the display mount 110 coupled to the display 102 and the holder 112 coupled to the stand 104 or other support surface. For the sake of clarity, the display 102, holder 112, and stand 104 are not shown in FIG. 3. In this example, the display mount 110 includes a set of curved tracks 302 fixed to the display and the holder 112 includes a plurality of rollers 304 that are configured to engage the curved tracks 302. The rollers 304 enable the display to be rotated along the tracks 302 to facilitate rotation of the display in a 90 degree arc. The positions of the rollers 304 are in a fixed relationship relative to the support surface and maintain a fixed positional relationship with one another through the rotation of the display while each roller 304 also maintains contact with it respective track 302 through the rotation.

It will be appreciated that the connection mechanism 300 may include additional features that, for the sake of clarity, are not shown in FIG. 3. For example, the connection mechanism 300 may include additional connectors, stops, support members, and other features for coupling the rails to the display mount, coupling the display mount to the display, supporting the rollers, preventing over-rotation of the display, and other functions. Additionally, the specific shape, position, and number of tracks or rollers may be different from what is shown in FIG. 3. In some examples, the rollers may be coupled to the display and the tracks may be coupled to the support surface.

The display may rotate in the direction indicated by the arrow 306 as a force or torque is applied to a portion of the display 102. A user may rotate the display 102 relative to the base 104 by applying a force to the display 102 manually (e.g., with the user's hand) or by actuating one or more electric, mechanical, or another powered assist (not shown). In some implementations, at least a portion of the force may be pneumatic, hydraulic, electrical, mechanical, magnetic, or other mechanism.

During the rotation of the display 102, the display 102 also experiences a downward translation. The translation may be caused by positioning the tracks 302 such that the center point of the display 102 is offset from the center of rotation. The center point of the display refers to the geometric center point of the display surface, and may be approximately equal to the center of gravity of the display. The center of rotation refers to the point around which the display rotates.

For purposes of the present description, the position of the tracks shown in FIG. 3 will be referred as the initial position, and the position of the tracks after the display has been rotated 90 degrees (shown in FIG. 4) will be referred to as the rotated position. In the initial position, the connection mechanism holds the display at its uppermost position. The initial position may correspond with either the landscape or portrait orientation of the display, depending on the specific implementation. The center point of the display 102 in the initial position may be referred to as the initial center point 308, and the center point of the display 102 in the fully rotated position may be referred to as the rotated center point 310. As explained further below, the center of rotation of the display is unfixed, meaning that the center of rotation of the display shifts during the rotation. The resting center of rotation 312 represents the center of rotation that will be experienced both at the beginning of the rotation and the end of the rotation (e.g., at 0 degrees and 90 degrees).

During the rotation from the initial position to the rotated position (e.g., landscape to portrait), the center point of the display will move downward relative to the support surface from the initial display center point 308 to the rotated display center point 310. The rotated display center point 310 of the display may be directly below the initial center point 308 of the display, so that the display is in the same horizontal position (X-direction) before and after the rotation. In the example shown in FIG. 3, the translation distance, $\Delta H$, is equal to two times the vertical distance, $D_V$, between the resting center of rotation 312 and the initial center point 308 of the display ($\Delta H = 2 \ast D_V$). The translation distance may be any suitable value as determined by the design considerations for a particular implementation. For example, the translation distance may be 10 mm, 50 mm, 100 mm, 200 mm, 300 mm, or any value in between. In some implementations, the translation may be greater than 300 mm.

During the rotation from first position to the second position, the display will experience a gravitation torque that increases as the center of the display moves away from the center of rotation in the X direction. In order to provide a more weightless feel to the user, the gravitation torque may be counterbalanced by one or more springs 314 that are configured to provide a spring torque in the opposite direction of the rotation. In the example shown in FIG. 3, the springs 314 are anchored at one end to the rails and anchored at the other end to the support surface. The anchor points may be selected so that the springs 314 rotate toward the center of rotation during the rotation to the rotated position, which causes the net spring torque to be reduced as the display rotates. The number of springs 314, thickness of the spring wire, and the spring anchor points may be selected so that the net spring torque more closely matches the change in gravitational torque throughout the rotation.

Due to the inherent differences between the gravitational torque and the spring torque, it is difficult to obtain a close match that completely balances the spring torque with the gravitation torque to create the sense of weightlessness. The result can be a non-zero net torque that changes throughout the rotation. To further reduce the net torque exerted by the display, the tracks are configured such that the center of rotation shifts throughout rotation of the display. In the example shown in FIG. 3, the center of rotation gradually shifts from the resting center of rotation 312 at zero degrees (initial position) to an intermediate center of rotation 316 at 45 degrees of rotation, and back to the resting center of rotation 312 at ninety degrees of rotation (rotated position). This also causes the trajectory of the display center point to be more linear compared to a fixed center of rotation design.

The movement of the center of rotation is achieved by the proper selection of the shape and position of the tracks 302. To cause the center of rotation to shift, each of the tracks 302 can have a different radius and different center point. A technique for determining the shape of each of the tracks 302 is described further in relation to FIG. 9. The distance between the resting center of rotation 312 and the intermediate center of rotation 316 may be selected depending on the gravitation torque characteristics desired for a specific implementation. In some examples, the distance between the resting center of rotation and the intermediate center of rotation may be approximately 5 to 30 mm.

By causing the center of rotation to shift position during the rotation, the gravitational torque experienced by the display during rotation can be controlled, to either increase or decrease the gravitational torque depending on the desired effect. For example, shifting the center of rotation in the negative X direction as shown in FIG. 3 will cause the gravitational torque to be higher in the rotated position compared to a fixed center of rotation. The resulting gravitational torque will therefore more closely match the spring torque, which also tends to increase as the springs are stretched. This enables a spring design (number of springs, anchor points, etc.) that more closely matches the gravitational torque and provides a better counterbalance and improved feeling of weightlessness. Additionally, the anchor points of the springs 314 may be selected so that they stay further away from the center of rotation, which results in less interference with the pass through cables (not shown). Example graphs describing the torque characteristics of the connection mechanism throughout the rotation are shown in FIGS. 5-8.

Figure 4:
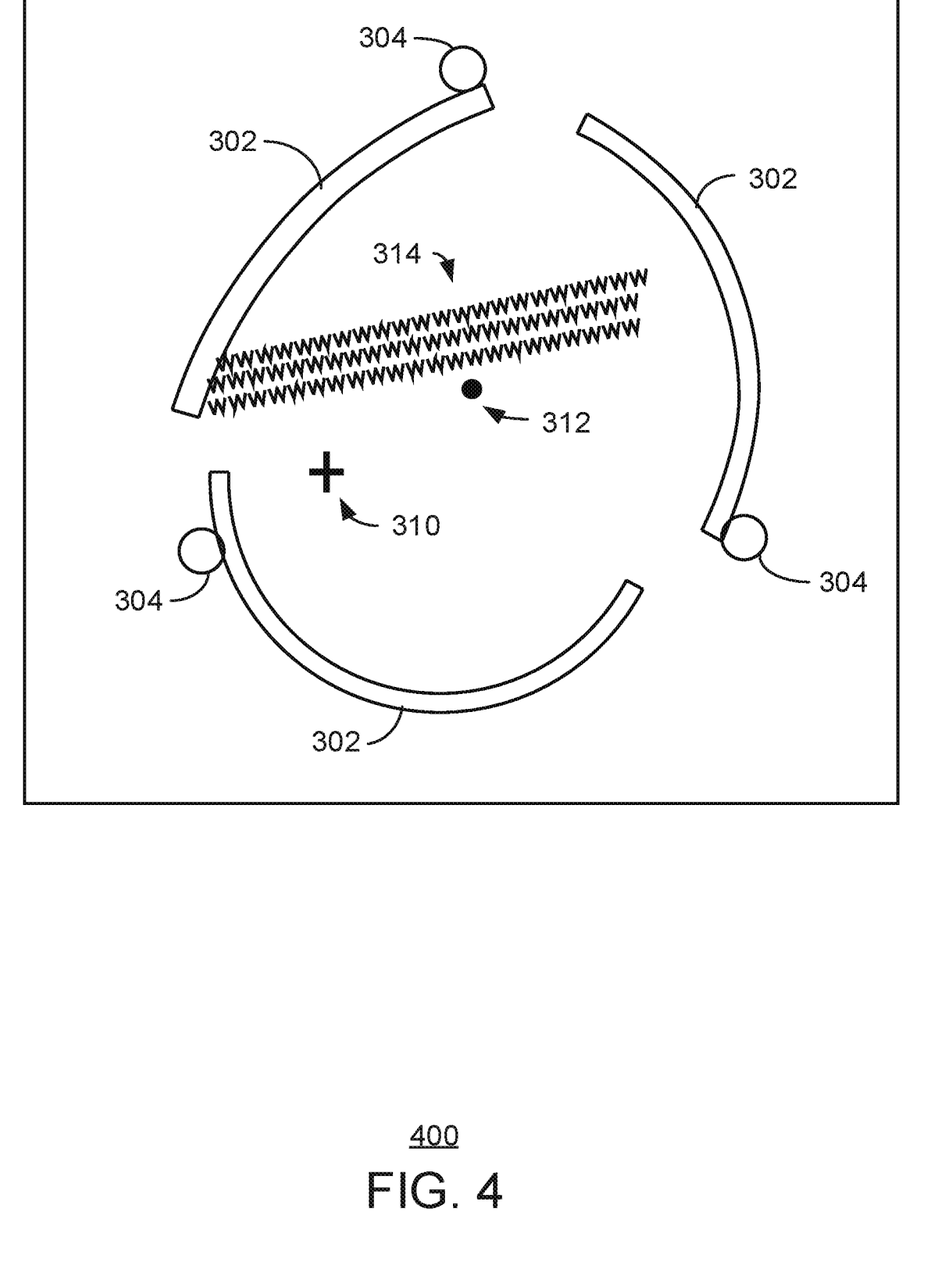
FIG. 4 is a front view of the connection mechanism rotated ninety degrees to the rotated position.

FIG. 4 is a front view of the connection mechanism rotated ninety degrees to the rotated position. As shown in FIG. 4, the rails have been rotated ninety degrees counter-clockwise, and the center point of the display has been translated downward to the rotated center point 310. In this position, it can be seen that the springs have been stretched and have rotated closer to the resting center of rotation 312.

FIGS. 5-8 are example curves describing mechanical characteristics of the connection mechanism throughout the rotation from the first position (e.g., landscape) to the second position (e.g., portrait). In each of the graphs, the X-axis represents the rotation angle, which varies from zero degrees, representing the first position, to 90 degrees, representing the second position. Additionally, each graph provides a comparison of the mechanical characteristics for the example connection mechanism described above, versus a connection mechanism with a fixed center of rotation.

Figure 5:
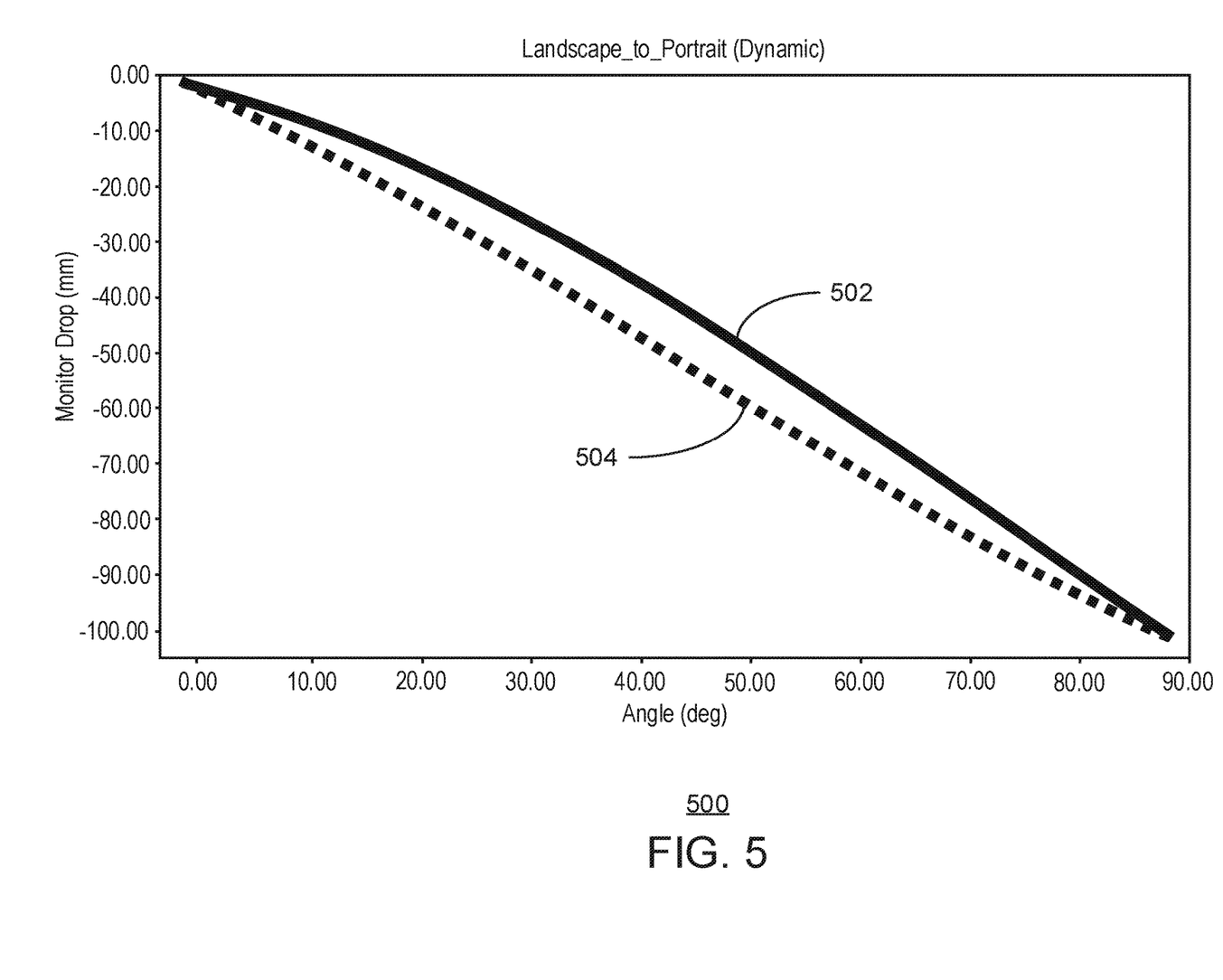
FIG. 5 is graph describing the monitor drop provided by the example connection mechanism throughout the rotation from the first position to the second position.

FIG. 5 is graph describing the monitor drop provided by the example connection mechanism throughout the rotation from the first position to the second position. The Y-axis represents the monitor drop in mm as the display rotates from 0 to 90 degrees. The solid curve 502 represents the monitor drop for an example connection mechanism with an unfixed center of rotation. For comparison, the dotted curve 504 represents the monitor drop for a connection mechanism with a fixed center of rotation. As seen in the graph 500, the fixed center of rotation causes the display to translate downward with an approximately linear relationship with the display angle. By contrast, the unfixed center of rotation causes the display to drop more slowly during the first half of the rotation, and more quickly during the second half of the rotation. In the present example, the monitor drop at 45 degrees is approximately 40 percent of the full translation distance.

Figure 6:
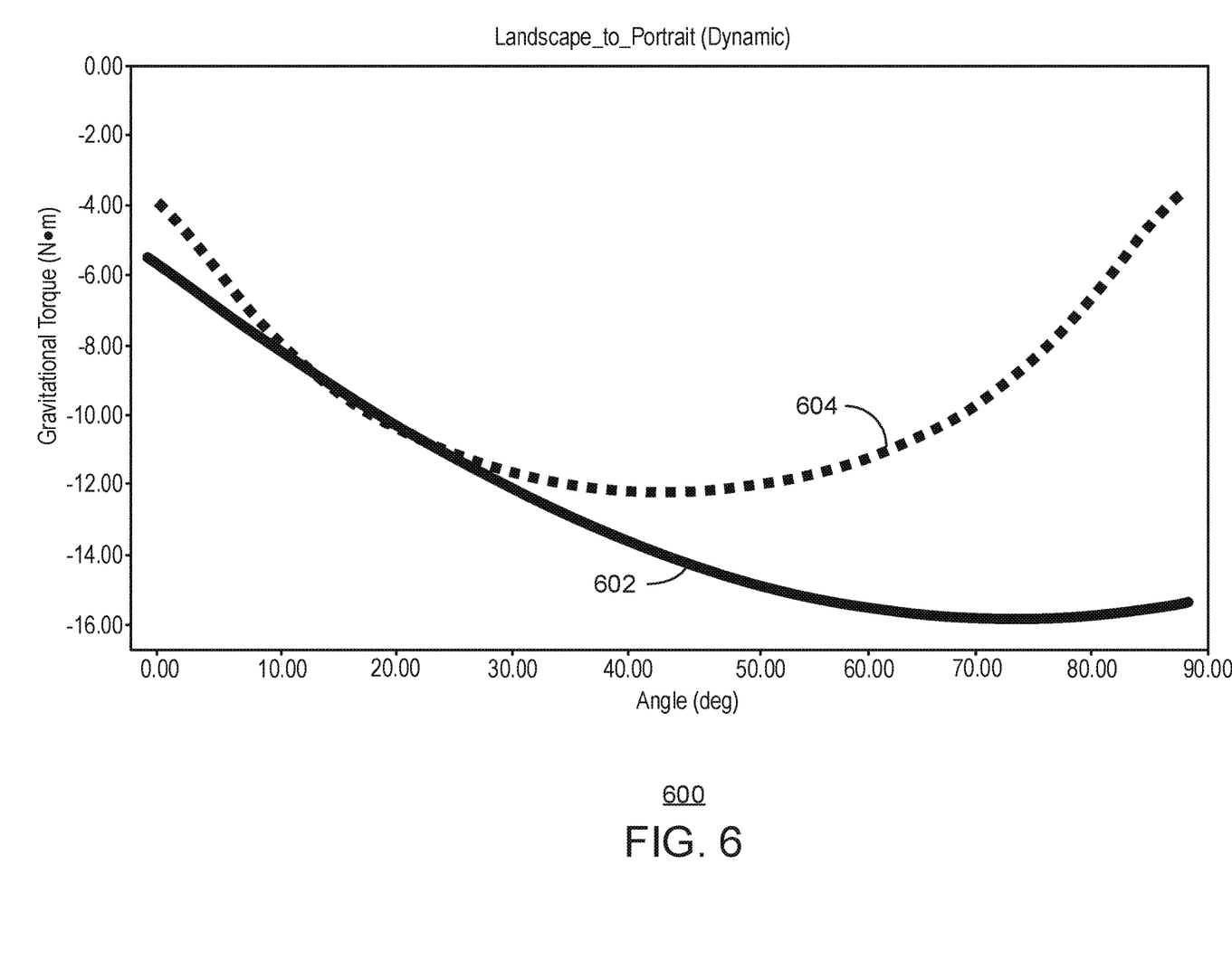
FIG. 6 is graph describing the gravitation torque experienced by the display throughout the rotation from the first position to the second position.

FIG. 6 is graph describing the gravitation torque experienced by the display throughout the rotation from the first position to the second position. The Y-axis represents the gravitational torque in Newton-meters (N·m) as the display rotates from 0 to 90 degrees. As stated above, the term gravitation torque refers to the torque required to hold the monitor in position against the force of gravity. The solid curve 602 represents the gravitational torque for an example connection mechanism with an unfixed center of rotation. For comparison, the dotted curve 604 represents the gravitational torque for a connection mechanism with a fixed center of rotation. As seen in the graph 600, the use of a fixed center of rotation results in a symmetric torque curve, which gradually increases up to 45 degree and then returns to its initial value at 90 degrees of rotation. By contrast, the unfixed center of rotation causes the gravitational torque to continue to increases past 45 degrees of rotation and reach a higher absolute torque value at 90 degrees of rotation.

Figure 7:
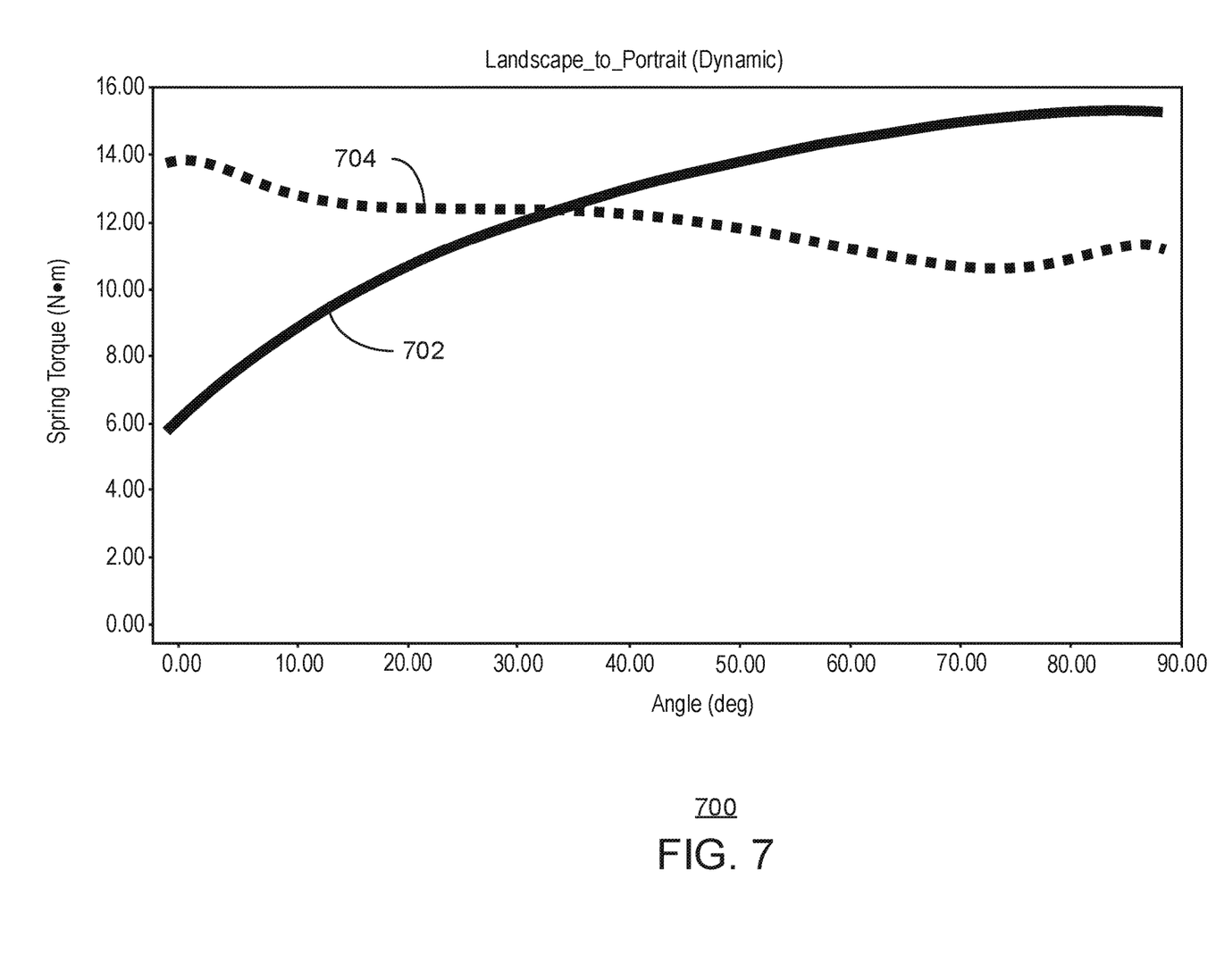
FIG. 7 is graph describing the spring torque exerted by the springs throughout the rotation from the first position to the second position.

FIG. 7 is graph describing the spring torque exerted by the springs throughout the rotation from the first position to the second position. The spring torque is the net torque exerted by the springs 314 (FIGS. 3 and 4) to counterbalance the force of gravity on the display. The net spring torque is a result of the inherent force exerted by the springs as they extend during rotation and the locations of the spring anchor points, which cause the springs to rotate closer to the center of rotation as the display is rotated. The Y-axis represents the spring torque in Newton-meters as the display rotates from 0 to 90 degrees. The solid curve 702 represents the spring torque for the example connection mechanism described above with an unfixed center of rotation. For comparison, the dotted curve 704 represents the spring torque for a connection mechanism with a fixed center of rotation and a different spring design.

As seen in the graph 700, the spring torque for the connection mechanism with a fixed center of rotation gradually decreases even though the spring force is gradually increasing. This is due to the movement of the springs toward the center of rotation. By contrast, the spring torque for the connection mechanism with the unfixed center of rotation starts with a relatively low torque value and gradually increases and levels out at a relatively high torque value compared to the spring design with the fixed center of rotation. As can be seen by a comparison of FIGS. 6 and 7, the profile of the spring torque more closely matches the inverse profile of the gravitational torque for the connection mechanism with the unfixed center of rotation.

Figure 8:
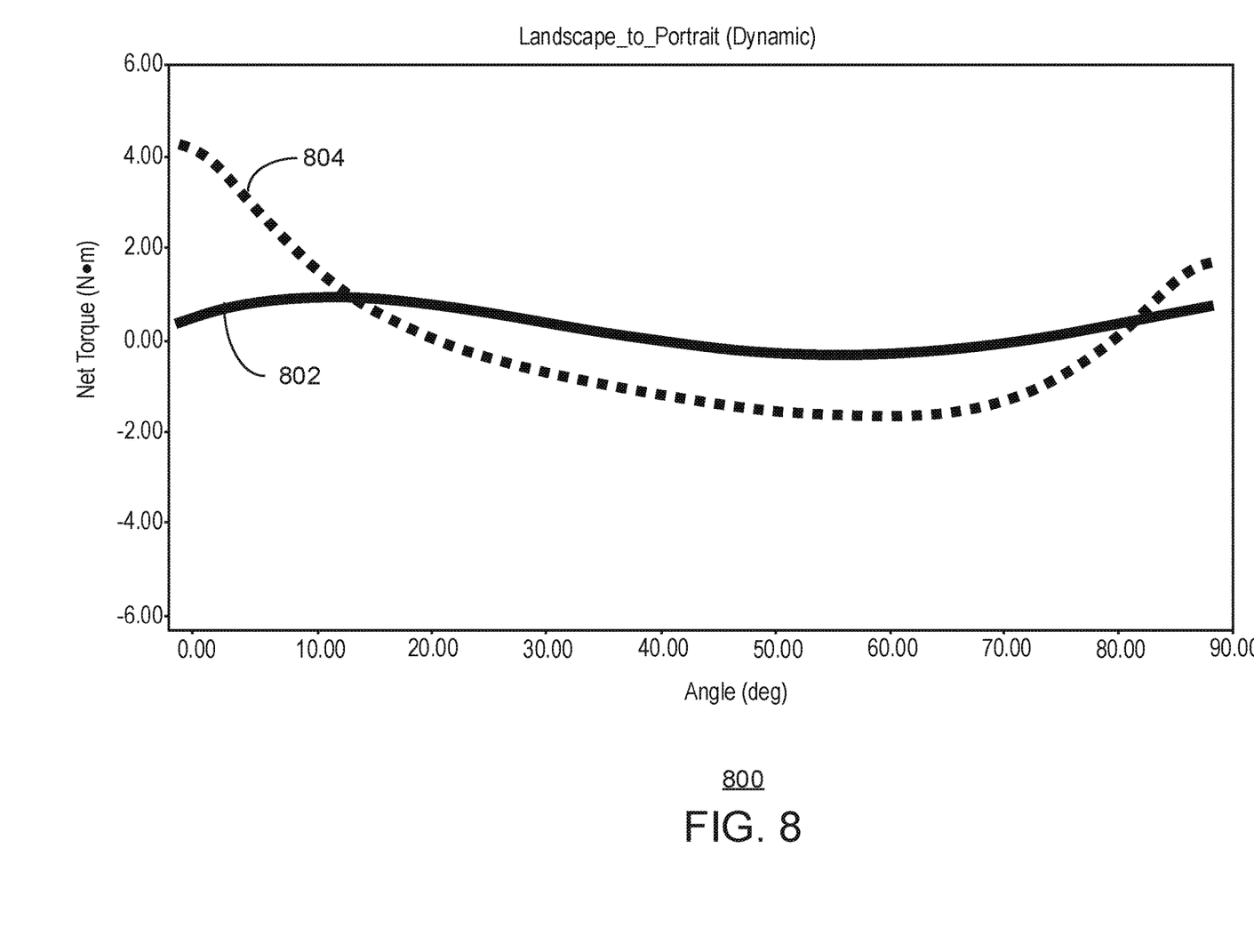
FIG. 8 is graph describing the net torque experienced by the display throughout the rotation from the first position to the second position.

FIG. 8 is graph describing the net torque experienced by the display throughout the rotation from the first position to the second position. The net torque is a sum of the gravitation torque (FIG. 6) and the counterbalancing spring torque (FIG. 7). The net torque may reflect the resistance and/or the assistance the user experiences while attempting to move the display between the first position and the second position. The Y-axis represents the net torque in Newton-meters as the display rotates from 0 to 90 degrees. The solid curve 802 represents the net torque for the example connection mechanism described above with an unfixed center of rotation. For comparison, the dotted curve 804 represents the spring torque for a connection mechanism with a fixed center of rotation and a different spring design. As seen in the graph 800, the spring torque for the connection mechanism with an unfixed center of rotation is much closer to zero throughout most of the rotation range compared to the connection mechanism with a fixed center of rotation. By using an unfixed center of rotation, the gravitational torque profile for the connection mechanism can be controlled to more closely match the forces exerted by the counterbalance springs. The result is a better balance between the gravitational torque and the spring torque throughout the range of rotation, and a more weightless feel for the user. In other words, the amount of user resistance or assistance applied by the user will be close to zero throughout the entire rotation range and in either rotational direction. In some examples, a sum of the gravitational torque and the spring torque will be less than 10 percent of the gravitational torque alone throughout the rotation of the display from the first position to the second position.

Figure 9:
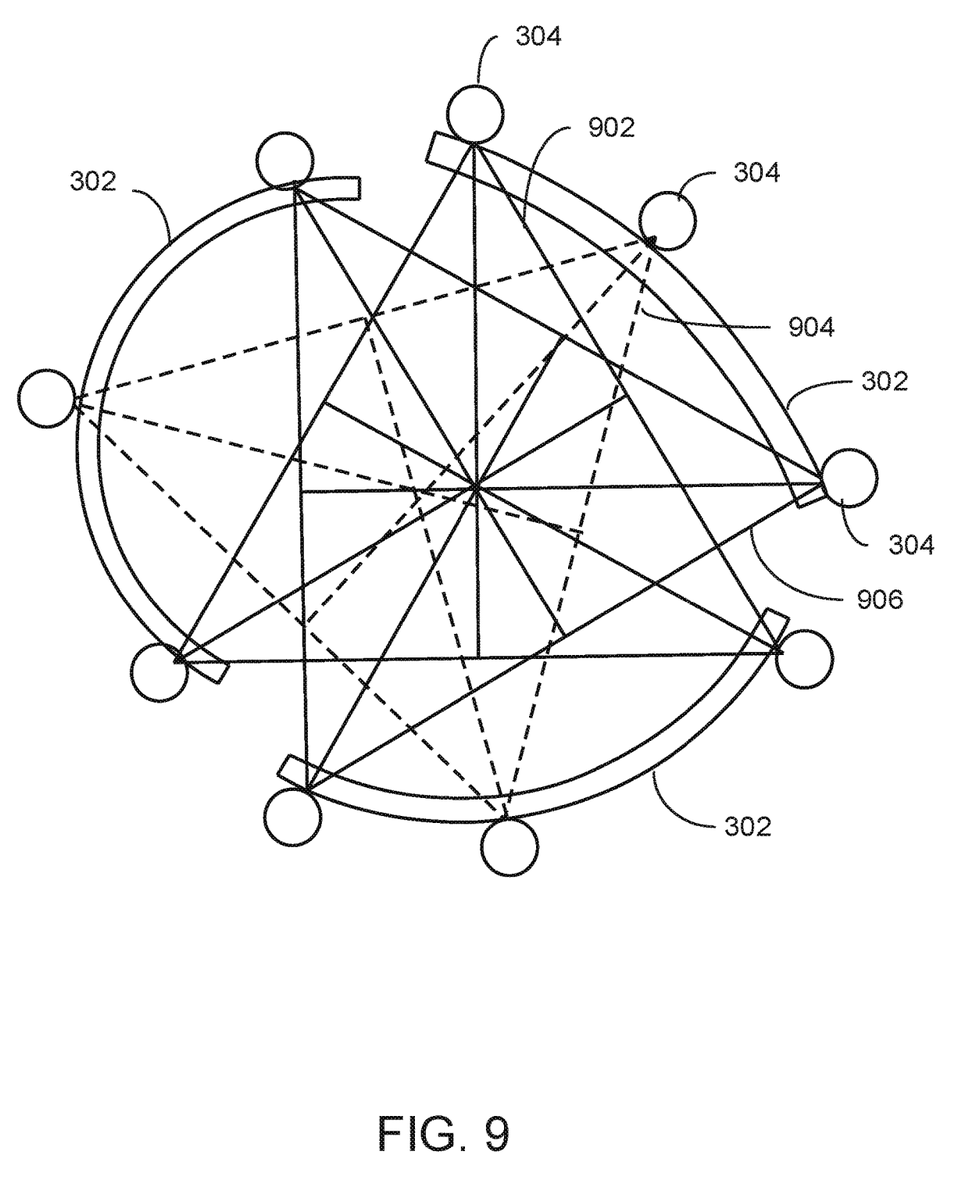
FIG. 9 is an illustration of a technique for determining a track position and curvature for a connection mechanism according to implementations described herein.

FIG. 9 is an illustration of a technique for determining a track position and curvature for a connection mechanism according to implementations described herein. As described above in relation to FIG. 3, the connection mechanism provides an unfixed center of rotation that shifts during the rotation. The shift in the center of rotation can be controlled by controlling the shape and position of the tracks 302. In FIG. 9, the triangles represent the positions of the rollers 304 as the roller positions change relative to the tracks 302 during the rotation of the display. For the present illustration, the positions of the tracks 302 remain stationary while the rollers 304 are shown as moving along the tracks 302. However, in an actual implementation, the rollers 304 can remain stationary while the tracks 302 rotate with the display.

The first triangle 902 represents the positions of the rollers 304 in the first position (i.e., zero degrees). The second triangle 904 represents the positions of the rollers 304 at 45 degrees of rotation. The third triangle 906 represents the positions of the rollers 304 in the second position (i.e., ninety degrees). Each triangle is the same size. Additionally, in this example, each triangle is equilateral. However, other shaped triangles may be used depending on the relative positions of the rollers to be fixed to the support surface.

The centroid of the first triangle 902 and the second triangle 904 are in the same position relative to the tracks 302, while the centroid of the second triangle 904 is shifted to the left to reflect the position of the center of rotation at 45 degrees (the intermediate center of rotation 316 shown in FIG. 3). With this arrangement of triangles it can be seen that the vertex of each triangle traces a circular arc. Accordingly, the track positions and shapes can be determined by fitting each track 302 to the arc traced by the corresponding triangle vertices. In this example, it can be seen that each circular arc may have a different radius, a different circle center, and a different arc length.

Additionally, although circular arcs are shown, the tracks 302 may also be non-circular in shape. For example, in an embodiment with four roller contact points, each track may be a non-circular curve such as a non-circular parametric curve or spline.

Figure 10:
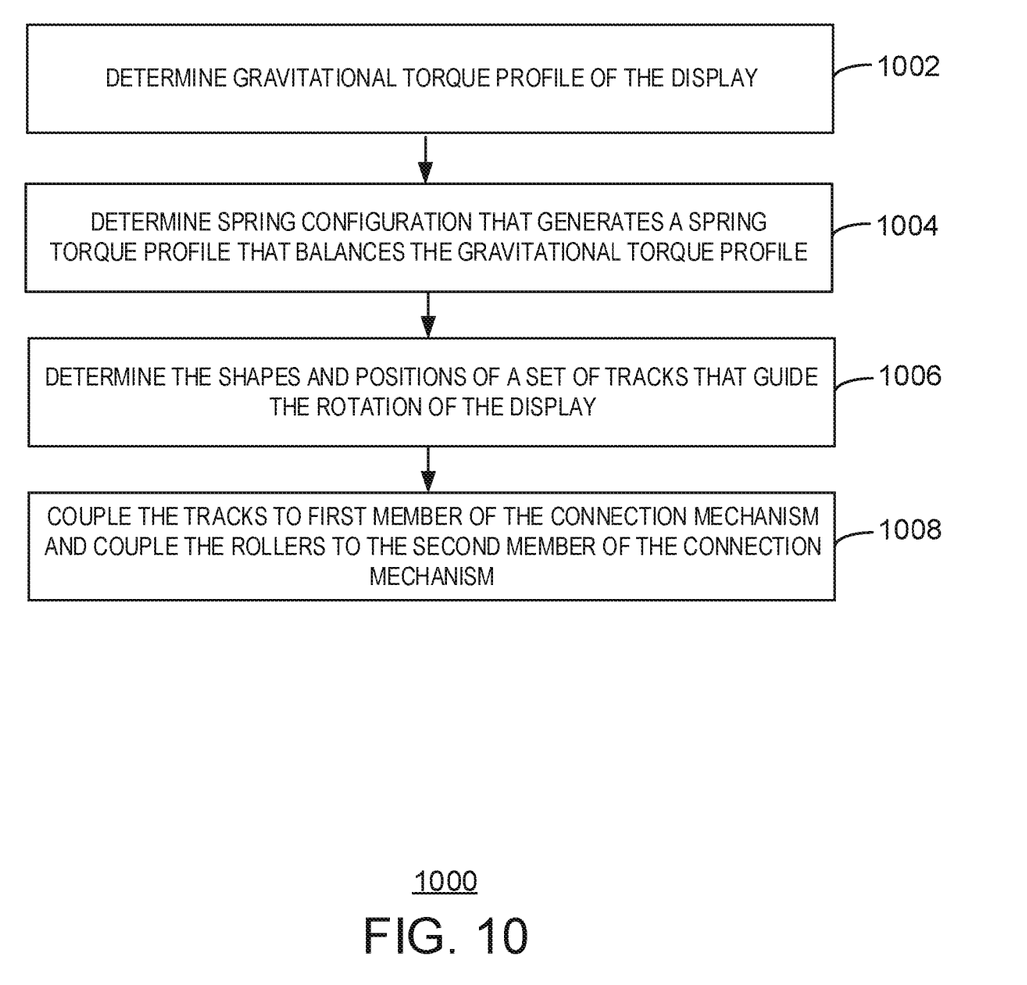
FIG. 10 is a process flow diagram describing an example method of manufacturing a connection mechanism for a display system.

FIG. 10 is a process flow diagram describing an example method of manufacturing a connection mechanism for a display system. The method may be used to create a connection mechanism configured to couple a display to a support surface and enable a user to simultaneously rotate and translate the display relative to the support surface while providing an approximately weightless feel to the user, as described above. Some of the processes described below may be performed by or with the aid of a computing system, such as a computer aided design tool. The process may begin at block 1002.

At block 1002, a gravitational torque profile is determined. The gravitational torque profile represents a gravitational torque experienced by the display as it rotates from the first position to the second position around the shifting center of rotation. The gravitational torque profile may be computed based in part on the weight of the display, and the center point of the display relative to the center of rotation of the display. The position of the intermediate center of rotation can be selected to cause the gravitational torque exerted by the display to be higher at the second position compared to the first position. For example, the gravitational torque exerted by the display may be at least two times higher at the second position compared to the first position.

At block 1004, a spring configuration can be determined that generates a spring torque profile that balances the gravitational torque profile. The spring torque can be computed as a function of the number of springs, the spring constant of the springs, and the anchor points of the springs.

At block 1006, the shapes and positions of a set of tracks that guide the rotation of the display are determined. As described above, the set of tracks are configured to engage a set of rollers that are in a fixed relationship with one another and enable the rotation of the tracks from the first position to the second position around the shifting center of rotation. The shape of the tracks can be determined by tracing or computing an arc formed by the rollers relative to the display as described above in relation to FIG. 9. Each track in the set of tracks may be in the shape of a circular arc, wherein the radius and circle center of each of the tracks is different from each of the other tracks. Additionally, each track may be shaped such that, during rotation of the display, the shifting center of rotation is to shift from a resting center of rotation at the first position, to an intermediate center or rotation at 45 degrees of rotation, and back to the resting center of rotation at the second position.

At block 1008, the set of tracks are coupled to a first member of the connection mechanism and the set of rollers are coupled to a second member of the connection mechanism. For example, the first member may be a display mount configured to be coupled to a display, and the second member may be a part of a support surface such as a stand. The set of tracks are coupled to the first member in accordance with the shapes and positions determined at block 1006. Additionally, the set of tracks are coupled to the first member at a position relative to the center point of the display that will cause a translation of the center point of the display relative to the second member of the connection mechanism as the display rotated from the first position to the second position. The tracks may be coupled to the first member in fixed positions such that the tracks are not movable relative to the first member or the display and maintain the same configuration during the rotation of the display.

The method 1000 should not be interpreted as meaning that the blocks are necessarily performed in the order shown. Furthermore, fewer or greater actions can be included in the method 1000 depending on the design considerations of a particular implementation.

Some of the associated figures describe concepts in the context of one or more structural components, variously referred to as functionality, modules, features, elements, or the like. The various components shown in the figures can be implemented in any manner, such as software, hardware, firmware, or combinations thereof. In some implementations, various components reflect the use of corresponding components in an actual implementation. In other implementations, any single component illustrated in the figures may be implemented by a number of actual components. The depiction of any two or more separate components in the figures may reflect different functions performed by a single actual component.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into multiple component blocks, and certain blocks can be performed in an order that differs from that which is illustrated herein, including a parallel manner of performing the blocks. The blocks shown in the flowcharts can be implemented by software, hardware, firmware, manual processing, or the like. As used herein, hardware may include computer systems, discrete logic components, such as application specific integrated circuits (ASICs), or the like.

As to terminology, the phrase "configured to" encompasses any way that any kind of functionality can be constructed to perform an identified operation. The functionality can be configured to perform an operation using, for instance, software, hardware, firmware, or the like. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media include physical hardware devices, such as magnetic storage devices, hard disk, floppy disk, magnetic strips, optical disk, compact disk (CD), digital versatile disk (DVD), smart cards, flash memory devices, among others. In contrast, computer-readable media, i.e., not storage media, may include communication media such as transmission media for wireless signals and the like.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interaction between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A device for supporting an electronic display, the device comprising:
   a support surface;
   a display mount configured to be coupled to a display;
   a connection mechanism to connect the display mount to the support surface, wherein the connection mechanism is configured to enable a rotation of the display mount between a first position corresponding to a landscape orientation of the display and a second position corresponding with a portrait orientation of the display, wherein the connection mechanism causes a translation of a center point of the display relative to the support surface in concert with the rotation; and a set of springs within the connection mechanism to provide a spring torque that counterbalances a gravitational torque exerted by the display, wherein the set of springs is anchored to the display mount at a first anchor point and anchored to the support surface at a second anchor point.

2. The device of claim 1, wherein the first position corresponds with a landscape orientation of the display, and the second position corresponds with a portrait orientation of the display.

3. The device of claim 1, wherein the translation of the center point of the display is a downward translation.

4. The device of claim 1, wherein, during rotation of the display mount, a center of rotation of the display is to shift, relative to the center point of the display, from a resting center of rotation at the first position, to an intermediate center of rotation at an intermediate angle of rotation, and back to the resting center of rotation at the second position, and wherein the intermediate center of rotation is positioned to cause the gravitational torque exerted by the display to be higher at the second position compared to the first position.

5. The device recited in claim 1, wherein, during rotation of the display mount, a center of rotation of the display is to shift, relative to the center point of the display, from a resting center of rotation at the first position, to an intermediate center of rotation at an intermediate angle of rotation, and back to the resting center of rotation at the second position.

6. The device of claim 5, wherein a distance between the intermediate center of rotation and the resting center of rotation is approximately 5 to 30 mm.

7. The device of claim 5, wherein the connection mechanism comprises a set of rollers coupled to the support surface and a set of tracks coupled to the display mount, the set of rollers to engage the set of tracks to enable rotation of the set of tracks through a ninety degree rotation between the first position and the second position, wherein the tracks are shaped to cause the center of rotation of the display to shift from the resting center of rotation at the first position, to the intermediate center of rotation at the intermediate angle of rotation, and back to the resting center of rotation at the second position.

8. The device of claim 7, wherein the set of rollers is coupled to the support surface in a fixed relationship with one another and maintain contact with the set of tracks throughout the ninety degree rotation.

9. The device of claim 7, wherein each track in the set of tracks is in a shape of a circular arc, wherein a radius and circle center of each of the tracks is different from each of the other tracks.

10. The device of claim 5, wherein the shift in the center of rotation of the display is configured to cause a gravitational torque profile of the display to more closely match a spring torque profile provided by the springs compared to a fixed center of rotation.

11. A display system, comprising:
a base;
a display coupled to the base;
a connection mechanism to connect the display to the base, wherein the connection mechanism is configured to enable a rotation of the display relative to the base between a first position corresponding to a landscape orientation of the display and a second position corresponding with a portrait orientation of the display, wherein the connection mechanism causes a translation of a center point of the display relative to the support surface in concert with the rotation; and
a set of springs within the connection mechanism to provide a spring torque that counterbalances a gravitational torque exerted by the display, wherein the set of springs is anchored to the display at a first anchor point and anchored to the base at a second anchor point.

12. The display system of claim 11, wherein the translation of the center point of the display is a downward translation.

13. The display system of claim 11, wherein a sum of the gravitational torque and the spring torque is less than 10 percent of the gravitational torque throughout the rotation of the display from the first position and the second position.

14. The display system of claim 11, wherein, during rotation of the display, a center of rotation of the display is to shift, relative to the center point of the display, from a resting center of rotation at the first position, to an intermediate center of rotation at an intermediate angle of rotation, and back to the resting center of rotation at the second position, and wherein the intermediate center of rotation is positioned to cause the gravitational torque exerted by the display to be higher at the second position compared to the first position.

15. The display system recited in claim 11, wherein, during rotation of the display, a center of rotation of the display is to shift, relative to the center point of the display, from a resting center of rotation at the first position, to an intermediate center of rotation at an intermediate angle of rotation, and back to the resting center of rotation at the second position.

16. The display system of claim 15, wherein a distance between the intermediate center of rotation and the resting center of rotation is approximately 5 to 30 mm.

17. The display system of claim 15, wherein the connection mechanism comprises a set of rollers coupled to the base and a set of tracks coupled to the display, the set of rollers to engage the set of tracks to enable rotation of the set of tracks through a ninety degree rotation between the first position and the second position, wherein the tracks are shaped to cause the center of rotation of the display to shift from the resting center of rotation at the first position, to the intermediate center of rotation at the intermediate angle of rotation, and back to the resting center of rotation at the second position.

18. The display system of claim 17, wherein each track in the set of tracks is in a shape of a non-circular curve.

19. The display system of claim 17, wherein each track in the set of tracks is in a shape of a circular arc, wherein a radius and circle center of each of the tracks is different from each of the other tracks.

20. The display system of claim 15, wherein the shift in the center of rotation of the display is configured to cause a gravitational torque profiled exerted by the display to more closely match a spring torque profile provided by the springs compared to a fixed center of rotation.

* * * * *